(12) United States Patent
Choi et al.

(10) Patent No.: US 12,091,597 B2
(45) Date of Patent: Sep. 17, 2024

(54) METHOD FOR PREPARING QUANTUM DOT FILM, QUANTUM DOT FILM PREPARED THEREBY, AND WAVELENGTH CONVERSION SHEET AND DISPLAY COMPRISING SAME

(71) Applicant: INNO QD CO., LTD, Yongin-si (KR)

(72) Inventors: Jae Gyun Choi, Yongin-si (KR); Oh Kwan Kwon, Anyang-si (KR); Jong Uk Bu, Seongnam-si (KR); Chul Park, Yongin-si (KR)

(73) Assignee: INNO QD CO., LTD, Yongin-si (KR)

( * ) Notice: Subject to any disclaimer, the term of this patent is extended or adjusted under 35 U.S.C. 154(b) by 823 days.

(21) Appl. No.: 17/255,756

(22) PCT Filed: Jun. 26, 2019

(86) PCT No.: PCT/KR2019/007711
§ 371 (c)(1),
(2) Date: Dec. 23, 2020

(87) PCT Pub. No.: WO2020/004927
PCT Pub. Date: Jan. 2, 2020

(65) Prior Publication Data
US 2021/0269709 A1    Sep. 2, 2021

(30) Foreign Application Priority Data
Jun. 29, 2018   (KR) ........................ 10-2018-0075242

(51) Int. Cl.
*C09K 11/02* (2006.01)
*B01J 13/18* (2006.01)
(Continued)

(52) U.S. Cl.
CPC ............. *C09K 11/025* (2013.01); *B01J 13/18* (2013.01); *C09D 5/22* (2013.01); *C09D 175/14* (2013.01);
(Continued)

(58) Field of Classification Search
None
See application file for complete search history.

(56) References Cited

U.S. PATENT DOCUMENTS 9,534,313 B2    1/2017   Linton
2002/0096795 A1   7/2002   Chandler
(Continued)

FOREIGN PATENT DOCUMENTS

JP      2016111292      6/2016
KR  10-2010-0120011    11/2010
(Continued)

OTHER PUBLICATIONS

KIPO, Office Action of KR 10-2018-0075242 dated Aug. 21, 2018.

*Primary Examiner* — Jeffrey D Washville
(74) *Attorney, Agent, or Firm* — LEX IP MEISTER, PLLC

(57) ABSTRACT

Proposed are a method of manufacturing a quantum-dot film having encapsulated quantum dots dispersed therein, in which quantum dots are uniformly dispersed in a matrix resin to thus increase quantum yield and in which deterioration of the quantum dots can be prevented through encapsulation, a quantum-dot film manufactured thereby, and a wavelength conversion sheet and a display including the same.

13 Claims, 7 Drawing Sheets

(51) Int. Cl.
  *B82Y 20/00*    (2011.01)
  *B82Y 40/00*    (2011.01)
  *C09D 5/22*     (2006.01)
  *C09D 175/14*   (2006.01)
  *C09K 11/88*    (2006.01)
  *H01L 33/50*    (2010.01)

(52) U.S. Cl.
  CPC .......... *C09K 11/883* (2013.01); *H01L 33/502* (2013.01); *B82Y 20/00* (2013.01); *B82Y 40/00* (2013.01)

(56) References Cited

U.S. PATENT DOCUMENTS

| 2006/0286378 | A1  | 12/2006 | Chiruvolu et al. | |
| 2012/0256134 | A1* | 10/2012 | Nick | C09K 11/025 |
| | | | | 252/301.36 |
| 2016/0068749 | A1* | 3/2016 | Kwon | G02B 6/0053 |
| | | | | 252/301.36 |

FOREIGN PATENT DOCUMENTS

| KR | 10-2013-0027317 | 3/2013 |
| KR | 10-2013-0105344 | 9/2013 |
| KR | 10-1396871 | 5/2014 |
| KR | 10-2016-0004524 | 1/2016 |
| KR | 10-2016-0069393 | 6/2016 |
| KR | 10-2017-0092934 | 8/2017 |
| KR | 10-1906445 | 10/2018 |

\* cited by examiner

50

METHOD FOR PREPARING QUANTUM DOT FILM, QUANTUM DOT FILM PREPARED THEREBY, AND WAVELENGTH CONVERSION SHEET AND DISPLAY COMPRISING SAME

CROSS REFERENCE TO RELATED APPLICATIONS

The present application claims priority based on Korean Patent Application No. 10-2018-0075242, filed on Jun. 29, 2018, the entire contents of which are incorporated as a part of the present specification.

TECHNICAL FIELD

The present disclosure relates to a method of manufacturing a quantum-dot film having encapsulated quantum dots dispersed therein, and a wavelength conversion sheet and a display including the quantum-dot film manufactured thereby.

BACKGROUND ART

Quantum dots (QDs) are ultrafine semiconductor particles having a size corresponding to ones of nanometers. When exposed to light, quantum dots emit light of a specific frequency due to the process in which electrons in an unstable state jump down from the conduction band to the valence band.

Typically, quantum dots generate light at shorter wavelengths with a decrease in the particle size thereof and emit light at longer wavelengths with an increase in the particle size thereof. Therefore, when the size of quantum dots is adjusted, visible light at a desired wavelength may be expressed, and various colors may be simultaneously implemented using quantum dots having different sizes. Accordingly, quantum dots are receiving attention as a next-generation light source because it is possible to realize a desired natural color by controlling the size of quantum dots, and also because of the good color gamut and good luminance thereof.

Quantum dots are formed into a film and then a barrier film is disposed on both sides of the film to afford a wavelength conversion sheet, which is then applied to a light-guide plate of a backlight unit for a liquid crystal display (LCD). When blue light radiated from the backlight unit passes through the quantum-dot sheet, red quantum dots are converted to red and green quantum dots are converted to green to emit light, and blue light is radiated without change, so a full color range may be realized. A display using such QDs is advantageous in that combinations of blue, green, and red close to natural light are possible, and thus a wide range of colors that are close to natural light and cannot be realized using existing fluorophores may be exhibited.

A conventional quantum-dot film is manufactured in a manner in which quantum dots are mixed with a curable resin and then formed into a coating film. Since the quantum dots have a size corresponding ones of nanometers, aggregation thereof occurs, making it difficult to uniformly disperse QDs in the curable resin, and thus light emission uniformity is greatly reduced. In particular, when quantum dots come into contact with moisture or air (i.e. oxygen) penetrating from the outside, light conversion efficiency may rapidly decrease, and the lifetime of the display may be reduced.

Moreover, a wavelength conversion sheet is manufactured in the form of a multilayer structure. In the case in which adhesion between the quantum-dot film and the barrier film is low, the penetration of moisture and air becomes easier, so the quantum-dot film is peeled from the barrier film and the quantum dots are oxidized, which is undesirable.

This problem may be overcome by encapsulating quantum dots with a hydrophobic resin, but the hydrophobic resin exhibits low adhesion to the barrier film, which creates another problem.

Recently, in order to realize uniform dispersion of quantum dots and adhesion to a barrier film, there are proposed methods in which quantum dots are granulated in an encapsulated form and the encapsulated quantum dots are dispersed in a matrix resin using a resin that strongly adheres to a barrier film. However, the quantum-dot film thus manufactured is problematic in that quantum dots may aggregate when encapsulated, and thus luminous efficiency is lowered due to the very wide particle size distribution thereof.

In this regard, Korean Patent No. 10-1396871 discloses encapsulation of the surface of quantum dots with polyethylene-based wax, polypropylene-based wax or amide-based wax in order to increase dispersion stability, UV stability and heat/water resistance. However, the wax described above is polar wax having acidity of 1 mg KOH/g to 200 mg KOH/g, which causes a problem in which it is difficult to realize uniform dispersion upon mixing with hydrophobic quantum dots.

In addition to the above patent, a number of patents have proposed encapsulation methods using wax. For example, the use of wax is mentioned in U.S. Pat. No. 9,534,313, US 2002-0096795 and US 2006-0286378. However, in these patents, only the contents of known wax are mentioned, and specific examples thereof or dispersion or effects of quantum dots using the same are never disclosed. Moreover, these patents do not mention any wavelength conversion sheet.

Meanwhile, with regard to the manufacture of wavelength conversion sheets having quantum dots, methods using emulsions have been devised.

Korean Patent Application Publication Nos. 10-2016-0069393 and 10-2013-0027317 disclose the preparation of an emulsion due to a difference in polarity/nonpolarity by dispersing a hydrophobic quantum dots polymer, and hydrophobic toluene in a polar solvent such as water. Subsequently, the solvent is removed from the emulsion to afford quantum-dot/polymer beads in a powder phase, which are then mixed with an acrylic monomer to afford a colloid, which is then cured, thereby manufacturing a quantum-dot film. This method has been noted to be capable of manufacturing encapsulated quantum dots having a uniform size by separately performing encapsulation and curing, but when removing the solvent (water, toluene, etc.), aggregation of quantum-dot/polymer beads occurs, and it is difficult to manufacture substantially uniform particles due to low dispersibility in the acrylic monomer. Moreover, processes including removal of the solvent, acquisition of the powder, etc., are complicated and costs increase, which is undesirable.

Accordingly, Korean Patent Application Publication No. 10-2017-0092934 discloses an emulsion configured to include an inner phase including a hydrophobic polymer and quantum dots and an outer phase including an acrylic resin. In order to manufacture a quantum-dot film, the emulsion is applied on a substrate, followed by performing ultraviolet curing once using a mercury lamp. This method is advantageous because the manufacturing process is simple, but coalescence between droplets constituting the inner phase occurs when ultraviolet curing is performed only once, so the encapsulation of quantum dots cannot be stably achieved.

CITATION LIST (1) Korean Patent Application Publication No. 10-2016-0069393 (Jun. 16, 2016), Method of manufacturing light conversion composite, light conversion composite, and light conversion sheet, backlight unit and display including the same
(2) Korean Patent Application Publication No. 10-2013-0027317 (Mar. 15, 2013), Quantum-dot complex and method of manufacturing the same
(3) Korean Patent Application Publication No. 10-2017-0092934 (Aug. 14, 2017), Composition for optical film and optical film including the same
(4) Korean Patent No. 10-1396871 (May 19, 2014), Complex, composition including the same and apparatus
(5) U.S. Pat. No. 9,534,313 (Jan. 3, 2017), Particles including nanoparticles dispersed in solid wax, method and uses thereof
(6) US 2002-0096795 (Mar. 4, 2003), Encapsulation of discrete quanta of fluorescent particles
(7) US 2006-0286378 (Dec. 21, 2006), Nanostructured composite particles and corresponding processes

DISCLOSURE

Technical Problem

Accordingly, the inventors of the present disclosure have continuously conducted research in order to solve the aforementioned problems in various ways, designed compositions in emulsion forms, in which the emulsion includes an inner phase including a nonpolar polyolefin-based wax and quantum dots and an outer phase that is photocurable, and ascertained that curing the inner phase and the outer phase of the emulsion in different ways is advantageous in various aspects such as dispersibility of quantum dots, uniformity of particles, convenience in processing, adhesion to barrier films, and the like, and thus the properties of the obtained quantum-dot film and wavelength conversion sheet may be improved.

Therefore, an objective of the present disclosure is to provide a method of manufacturing a quantum-dot film using a curable emulsion composition and a quantum-dot film manufactured thereby.

Another objective of the present disclosure is to provide a wavelength conversion sheet including the quantum-dot film and a display including the same.

Technical Solution

In order to accomplish the above objectives, the present disclosure provides a method of manufacturing a quantum-dot film, suitable for manufacturing a quantum-dot film in which particles encapsulated obtained by encapsulating quantum dots with an encapsulation resin are dispersed in a matrix resin, the method including:
preparing a curable emulsion composition including an inner phase including quantum dots and a nonpolar polyolefin-based wax and an outer phase including a photocurable polymerization compound and a photoinitiator, the inner phase being dispersed in a droplet form in the outer phase;
encapsulating the quantum dots of the inner phase by cooling the curable emulsion composition to a temperature equal to or lower than the melting point of the nonpolar polyolefin-based wax; and
curing the outer phase by irradiating the obtained suspension with light.

Here, the nonpolar polyolefin-based wax has the repeating structure of each of Chemical Formula 1 and Chemical Formula 2 below:

(in Chemical Formulas 1 and 2, $R_1$ is a C1-C15 linear or branched alkyl group, $0.01 \leq b \leq 0.96$, $a+b=1$).

The nonpolar polyolefin-based wax may have a weight average molecular weight of 300 to 30,000 and a melting point of 40 to 180° C.

Also, the nonpolar polyolefin-based wax may be at least one selected from the group consisting of high-density polyethylene (HDPE) wax, low-density polyethylene (LDPE) wax, linear low-density polyethylene (LLDPE) wax, and combinations thereof.

In addition, the present disclosure provides a wavelength conversion sheet configured such that the quantum-dot film is interposed between a pair of barrier films and a display including the same.

Advantageous Effects

According to the present disclosure, a curable emulsion composition is prepared using an emulsion, thus solving problems due to aggregation of quantum dots during conventional preparation processes, thereby making it possible to stably manufacture a quantum-dot film having quantum dots.

The quantum-dot film thus manufactured is configured such that quantum dots are uniformly dispersed at a high concentration in a matrix resin, thus increasing the conversion efficiency of quantum dots, preventing penetration of moisture or oxygen from the outside due to the encapsulation resin that encapsulates the quantum dots and the resin that constitutes the matrix resin, exhibiting high light transmittance, and preventing the deterioration of quantum dots.

The quantum-dot film can be applied to a wavelength conversion sheet for a display, and is capable of realizing a high-quality screen.

DESCRIPTION OF REFERENCE NUMERALS

Figure 1:
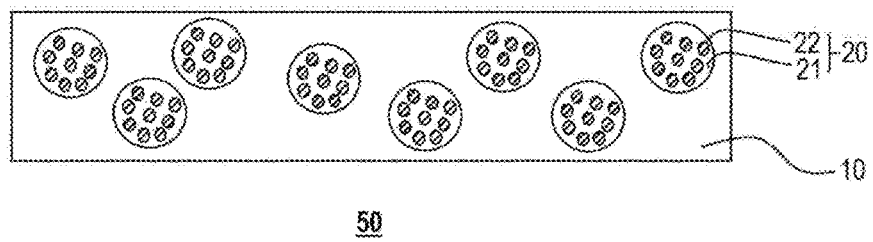
FIG. 1 is a cross-sectional view showing a quantum-dot film according to the present disclosure.

10: matrix resin 20: encapsulated particles
21: encapsulation resin 22: quantum dots
23: ceramic nanoparticles 50: quantum-dot film
60: first barrier film 70: second barrier film
100: wavelength conversion sheet

BEST MODE

FIG. 1 is a cross-sectional view showing a quantum-dot film according to the present disclosure.

As shown in FIG. 1, a quantum-dot film 50 is configured such that encapsulated particles 20, obtained by quantum dots 22 with an encapsulation resin 21, are dispersed in a matrix resin 10.

The quantum-dot film 50 according to the present disclosure is configured such that the encapsulated particles 20 are uniformly dispersed in the matrix resin 10. In the manufacturing method therefor, a curable emulsion composition is prepared, in which encapsulation of quantum dots using a nonpolar polyolefin-based wax in the inner phase and photocuring of the outer phase through light irradiation are independently performed.

Curable Emulsion Composition

In the manufacture of a film using quantum dots, uniform dispersion of quantum dots is of critical importance. If quantum dots are not thoroughly dispersed in the film, variation in color conversion may occur at the macroscopic level, and quantum yield may significantly decrease owing to energy transfer between quantum dots at the microscopic level.

According to the present disclosure, in order to manufacture the quantum-dot film 50 having the above structure, a curable emulsion composition in an emulsion form, in which an inner phase and an outer phase are present, is prepared, and encapsulation of the quantum dots 22 and curing of the matrix resin 10 in the emulsion are performed using different curing systems.

'Emulsion' may mean a layer configured such that any one of two or more phases that do not mix with each other forms an outer phase or a continuous phase in the layer and the remaining one thereof is dispersed in the outer phase to form an inner phase or a dispersed phase. Each of the inner phase and the outer phase may be a solid, semi-solid or liquid, and the inner phase and the outer phase may be the same as or different from each other. Typically, the term 'emulsion' is used for two or more liquids that do not mix with each other, but the emulsion in the present application is not necessarily an emulsion formed by two or more liquids.

The curable emulsion composition of the present disclosure includes an inner phase including the quantum dots 22 and the encapsulation resin 21 and an outer phase including a photocurable polymerization compound for the preparation of the matrix resin 10, these phases being phase-separated from each other due to the hydrophobic/hydrophilic properties thereof.

Here, 'hydrophobic material' refers to a material exhibiting low intermolecular attraction to an aqueous solvent such as water, and 'hydrophilic material' refers to a material exhibiting high intermolecular attraction to an aqueous solvent such as water. As such, the criteria for distinguishing the hydrophobic material and the hydrophilic material from each other are not particularly limited, so long as they are phase-separated from each other to form individual regions.

The curable emulsion composition of the present disclosure is configured to include a hydrophobic region including the quantum dots 22 and the encapsulation resin 21 in a droplet state and a hydrophilic region including the photocurable polymerization compound, in which the two regions that do not mix with each other are separated from each other. Due to this phase separation, each of the inner phase and the outer phase may be independently cured. Moreover, since it is possible to cure the encapsulation resin 21 by adjusting the temperature (e.g. applying heat or removing heat) and to cure the matrix resin 10 through light irradiation, each of the encapsulation resin 21 and the matrix resin 10 may be stably cured.

In particular, the curable emulsion composition of the present disclosure is capable of using quantum dots 22 at a high concentration, and because the droplet size is constant, the encapsulated particles 20 obtained by encapsulating the quantum dots 22 with the encapsulation resin 21 have a uniform size.

Hereinafter, the specific composition of the curable emulsion composition is described in detail.

(i) Inner-Phase Composition

The 'inner-phase composition' refers to a composition that is discontinuously dispersed in the curable emulsion composition. The inner-phase composition serves to prepare encapsulated particles 20, and includes quantum dots 22 and the encapsulation resin 21.

Due to the quantum confinement effect, the quantum dots 22 absorb light emitted from a light source and then convert the wavelength of light having a wavelength corresponding to the band gap of the quantum dots 22 to thereby emit light.

The quantum dots 22 may include a semiconductor selected from the group consisting of Group II-VI, III-V, IV-VI and IV semiconductors and mixtures thereof. More specifically, the quantum dots 22 may be particles having a monolayer or multilayer structure including one or more semiconductor crystals selected from the group consisting of, for example, Cds, Cdo, CdSe, CdTe, $Cd_3P_2$, $Cd_3As_2$, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, Bao, BaS, BaSe, BaTe, HgO, HgS, HgSe, HgTe, $HgI_2$, AgI, AgBr, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, $GaInP_2$, InN, InP, InAs, InSb, $In_2S_3$, $In_2Se_3$, $TiO_2$, BP, Si, Ge, and combinations thereof.

Also, the quantum dots 22 may include Group II-VI compound semiconductor nanocrystals such as CdS, CdSe, CdTe, ZnS, ZnSe, ZnTe, HgS, HgSe and HgTe, Group III-V compound semiconductor nanocrystals such as GaN, GaP, GaAs, InP and InAs, or mixtures thereof. The center particles may have a core/shell structure, and each of the core and shell of the center particles may include the above-listed compounds. The above-listed compounds may be included alone or in combinations of two or more thereof in the core or shell. For example, the center particles may have a CdSe—ZnS (core/shell) structure composed of a core including CdSe and a shell including ZnS.

In addition, the quantum dots 22 may have a core/shell structure or an alloy structure. The quantum dots 22 having a core/shell structure may grow a shell layer in various shapes by adding a different component upon growing a seed crystal structure. The formation of the core/shell structure is advantageous because not only properties such as high luminous efficiency, high luminous clarity and the like but also other properties such as thermal stability or insulation performance may be satisfied. The quantum dots 22 having a core/shell structure or an alloy structure may be CdSe/ZnS, CdSe/ZnSe/Zns, CdSe/CdS$_x$(Zn$_{1-y}$Cd$_y$) S/ZnS, CdSe/CdS/ZnCdS/ZnS, InP/ZnS, InP/Ga/ZnS, InP/ZnSe/ZnS, PbSe/PbS, CdSe/CdS, CdSe/CdS/ZnS, CdTe/CdS, CdTe/ZnS, CuInS$_2$/ZnS, or Cu$_2$SnS$_3$/ZnS.

Also, the quantum dots 22 may be perovskite nanocrystalline particles. Perovskite has the structure of ABX$_3$, A$_2$BX$_4$, ABX$_4$ or A$_{n-1}$B$_n$X$_{3n+1}$ (in which n is an integer of 2 to 6), in which A is an organic ammonium or alkali metal material, B is a metal material, and X is a halogen element.

The organic ammonium may be amidinium-based organic ions, (CH$_3$NH$_3$)$_n$/((C$_x$H$_{2x+1}$)$_n$NH$_3$)$_2$ (CH$_3$NH$_3$)$_n$, (RNH$_3$)$_2$, (C$_n$H$_{2n+1}$NH$_3$)$_2$, (CF$_3$NH$_3$), (CF$_3$NH$_3$)$_n$, ((C$_x$F$_{2x+1}$)$_n$NH$_3$)$_2$ (CF$_3$NH$_3$)$_n$, ((C$_x$F$_{2x+1}$)$_n$NH$_3$)$_2$ or (C$_n$F$_{2n+1}$NH$_3$)$_2$ (in which n is an integer of 1 or more and x is an integer of 1 or more), and the alkali metal material may be Na, K, Rb, Cs or Fr. Also, B may be a divalent transition metal, a rare-earth metal, an alkaline earth metal, Pb, Sn, Ge, Ga, In, Al, Sb, Bi, or Po ions or combinations thereof, and X may be Cl, Br, or I ions or combinations thereof.

Also, the quantum dots may be doped perovskite nanocrystalline particles. The doped perovskite includes a structure of ABX$_3$, A$_2$BX$_4$, ABX$_4$ or A$_{n-1}$B$_n$X$_{3n+1}$ (in which n is an integer of 2 to 6), in which a portion of A is substituted with A', a portion of B is substituted with B', or a portion of X is substituted with X', A and A' being organic ammonium, B and B' being a metal material, and X and X' being a halogen element.

Here, A and A' may be amidinium-based organic ions, (CH$_3$NH$_3$)$_n$, ((C$_x$H$_{2x+1}$)$_n$NH$_3$)$_2$(CH$_3$NH$_3$)$_n$, (RNH$_3$)$_2$, (C$_n$H$_{2n+1}$NH$_3$)$_2$, (CF$_3$NH$_3$), (CF$_3$NH$_3$)$_n$, ((C$_x$F$_{2x+1}$)$_n$NH$_3$)$_2$ (CF$_3$NH$_3$)$_n$, ((C$_x$F$_{2x+1}$)$_n$NH$_3$)$_2$ or (C$_n$F$_{2n+1}$NH$_3$)$_2$ (in which n is an integer of 1 or more and x is an integer of 1 or more), B and B' may be divalent transition metal, rare-earth metal, alkaline earth metal, Pb, Sn, Ge, Ga, In, Al, Sb, Bi or Po, and X and X' may be Cl, Br or I.

The quantum dots 22 may have a spherical shape, an elliptical shape, a rod shape, a wire shape, a pyramid shape, a cube shape or other geometric or non-geometric shapes. These are usually spherical or elliptical nanoparticles and may have an average particle diameter of 1 to 10 nm, and the light emission wavelength varies depending on the size thereof, so quantum dots 22 having an appropriate size may be selectively used to afford light of a desired color. Typically, quantum dots 22 having a larger particle size emit light of quite low energy compared to quantum dots 22 made of the same material but having a smaller particle size. In the present disclosure, the quantum dots 22 may include at least one selected from the group consisting of, for example, quantum dots 22 that convert blue light into red light, quantum dots 22 that convert blue light into green light, and quantum dots 22 that convert green light into red light.

In particular, the quantum dots 22 are provided in the form of a colloid (or a suspension) by being dispersed in a solvent (e.g. toluene), and are provided in a form to which attached a ligand is for surface stabilization. Here, the ligand is a hydrophobic organic ligand that increases the dispersibility of quantum dots 22 and prevents the quantum dots from aggregating. The ligand may be removed before use, or may be substituted with another ligand and used. The ligand may prevent quantum dots 22 adjacent to each other from easily aggregating and being quenched. Moreover, the ligand is coupled with the quantum dots 22, so the quantum dots 22 become hydrophobic. Accordingly, when quantum dots 22 are dispersed in a resin for forming a film or a coating layer, the use of quantum dots 22 including the ligand is capable of improving dispersibility thereof in the resin compared to quantum dots 22 not including the ligand.

The ligand may be represented by Chemical Formula —(CH$_2$)$_p$—R$_2$ (1≤p≤40, R$_2$—OH, CO$_2$H, NH$_2$, SH, or PO). Preferably, 6≤p≤30, an alkyl group represented by CH$_2$, may be linear or branched.

Specific examples of the ligand may include hexadecylamine, octadecylamine, octylamine, trioctylphosphine, triphenylphosphine, t-butylphosphine, trioctylphosphine oxide, pyridine, and thiophene, with octadecylamine being preferably used.

The encapsulation resin 21 encapsulates a plurality of quantum dots 22 to thus achieve uniform dispersion of the quantum dots in the matrix resin 10. This resin is hydrophobic and is highly compatible with the quantum dots 22, and may be uniformly present in an inner phase together therewith. The encapsulation resin 21 is not particularly limited, so long as it is a hydrophobic resin, but a wax-based compound is preferably used. These are compounds that may be solidified by heat.

The wax-based compound is a resin having a molecular weight of hundreds to tens of thousands, and is solid at room temperature but has a melting point of 40 to 180° C. and is changed into a fluid when heated to a temperature equal to or higher than the melting point thereof. The resin includes petroleum wax, natural animal wax, natural vegetable wax, and synthetic wax, depending on the raw material thereof. Among these, in the present disclosure, a polyolefin-based wax, preferably a nonpolar polyolefin-based wax, is used.

Molecules exhibit polarity and nonpolarity depending on the arrangement of atoms, and polar materials are miscible with each other and nonpolar materials are miscible with each other. In general, since polar bonding strength is greater than nonpolar bonding strength, nonpolar molecules cannot break the bond between polar molecules, so mixing between nonpolar and polar molecules is not possible.

The quantum dots are provided in a state in which a ligand is attached to the surface thereof for dispersion as described above, of which a ligand such as octadecylamine exhibits nonpolarity. Specifically, the encapsulation resin 21 in a liquid phase is present in a loosely chain-entangled state, and the quantum dots 22 are present between the chains.

In particular, the nonpolar polyolefin-based wax of the present disclosure is present as a lamella model in which the polymer chains in the state of being unfolded and then folded form a bundle, rather than the chains being arranged in a disorderly and irregular manner. Accordingly, the quantum dots 22 are safely seated between the chains that make up the lamella. Thus, the encapsulation resin 21 is solidified due to the lowered temperature, and the quantum dots 22 present between the chains are encapsulated by the encapsulation resin 21. Here, the ligand on the surface of the quantum dots 22 is not only hydrophobic but also nonpolar. In the case in which a polar polymer is used as a resin for encapsulating the quantum dots 22, the quantum dots 22 are present outside the chain of the encapsulation resin 21, and the quantum dots 22 are not uniformly encapsulated in the polymer. The binding of nonpolar molecules is achieved by the Van der Waals action, and in the present disclosure, when a nonpolar polymer is used, the Van der Waals action with the ligand of the quantum dots 22 occurs. Accordingly, the quantum dots 22 are present between or near r the polymer chains in an entangled state, so a large amount of quantum dots 22 may be more uniformly encapsulated.

The polyolefin-based wax is typically exemplified by polyethylene-based wax. The polyethylene-based wax has a repeating unit of —[$CH_2$—$CH_2$]—, and is nonpolar due to the symmetrical structure of $CH_2$. The ligand of the quantum dots 22 is present between the $CH_2$ chains of the polyethylene-based wax. Here, when a hydrophobic substituent is present instead of H connected to C, the substituent acts as an arm, so the quantum dots 22 may be more easily fixed to the polymer. In general, an increase in hydrophobicity may vary depending on the type and length of the substituent.

In the present disclosure, some H atoms of $CH_2$ are substituted with alkyl groups, thereby simultaneously maintaining nonpolarity and increasing hydrophobicity and also increasing the likelihood of Van der Waals action with the ligand of the quantum dots 22. Specifically, the alkyl-group-substituted nonpolar polyolefin-based wax has a repeating structure of each of Chemical Formula 1 and Chemical Formula 2 below:

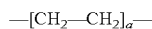  [Chemical Formula 1]

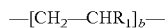  [Chemical Formula 2]

(in Chemical Formulas 1 and 2, $R_1$ is a C1-C15 linear or branched alkyl group, $0.01 \leq b \leq 0.96$, $a+b=1$).

Preferably, $R_1$ is a C1-C15 alkyl group, and more preferably a C1-C10 alkyl group. Here, examples of the alkyl group may include a methyl group, an ethyl group, a propyl group, an isopropyl group, a butyl group, an isobutyl group, a t-butyl group, a pentyl group, a hexyl group, a heptyl group, an octyl group, a nonyl group, a decyl group, an undecyl group, a dodecyl group, a 2-methyl-pentyl group, a 2-ethyl-hexyl group, a 2-propyl-heptyl group, and a 2-butyl-octyl group. As the number of carbon atoms of $R_1$ increases, hydrophobicity may increase, and the quantum dots 22 may be more easily encapsulated. However, if the number thereof is excessively high, introduction of the quantum dots 22 may become difficult. Hence, it is advantageous to have a substituent having the number of carbon atoms falling within the above range.

Here, when $R_1$ is an alkyl group, the alkyl group may be one or more alkyl groups. Specifically, when the repeating units of Chemical Formula 1 and Chemical Formula 2 form the main chain, $R_1$ may be substituted only with a methyl group (e.g. HDPE), or may be substituted with two or more groups such as a methyl group, a propyl group and/or a hexyl group.

Also, b is related to the degree of substitution of the alkyl group, and the higher the numerical value thereof, the higher the degree of substitution of the alkyl group. When the degree of substitution of the alkyl group is high, hydrophobicity increases, but the properties of 'wax', particularly the melting point thereof, may increase due to excessive substitution, making it difficult to prepare an emulsion composition. Hence, it is important to limit the numerical values of a and b.

Specifically, b is 0.01 to 0.50, more preferably 0.03 to 0.30, and a has a numerical value that satisfies a+b=1.

Also, the nonpolar polyolefin-based wax of the present disclosure has a molecular weight of 300 to 30,000, preferably 700 to 25,000, and more preferably 1000 to 20,000, and a melting point of 40 to 180° C., preferably 90 to 170° C., and more preferably 100 to 160° C.

In a specific embodiment of the present disclosure, the nonpolar polyolefin-based wax may be high-density polyethylene (HDPE) wax, low-density polyethylene (LDPE) wax, or linear low-density polyethylene (LLDPE) wax. Here, HDLE, LDPE, and LLDPE are classified based on a difference in the density depending on the manufacturing method, HDPE has a density of 0.941 g/cm³ or more, LDPE has a density of 0.915-0.925 g/cm³, and LLDPE has a density of 0.915-0.925 g/cm³.

The technology of the nonpolar polyolefin-based wax of the present disclosure has the following differences from the conventionally proposed technology. Specifically, the use of polyethylene-based wax for encapsulating quantum dots has been conventionally proposed. However, when polyethylene, which is essentially nonpolar, is mixed with a material having a different polarity, particularly quantum dots, it is not easy to encapsulate the quantum dots due to the weak interaction at the interface. For this reason, a method of modifying the polyethylene-based wax with a substituent having a polar group is used, but processing costs are increased. Since quantum dots are usually hydrophobic, the use of the polyethylene-based wax substituted with the polar group is problematic in that it is not easy to encapsulate a sufficient amount of quantum dots. In particular, dispersion stability is low due to a polarity-nonpolarity problem when an emulsion composition is prepared and thus a film is manufactured. However, the use of nonpolar polyolefin-based wax having repeating structures of Chemical Formulas 1 and 2 is capable of fundamentally preventing the above problems from occurring. Furthermore, commercially available quantum dots 22 obviate the need for ligand treatment, and thus processing costs may be lowered and the process may be simplified.

As needed, the inner-phase composition may further include a solvent for dispersing the quantum dots 22 and the encapsulation resin 21. Here, the solvent may be a nonpolar solvent. The nonpolar solvent may be at least one selected from the group consisting of aliphatic hydrocarbon-based solvents including pentane, hexane, heptane, octane, decane, cyclohexane and isoparaffin, aromatic hydrocarbon-based solvents including toluene, benzene, dichlorobenzene and chlorobenzene, ether-based solvents including tetrahydrofuran, 1,4-dioxane and diethyl ether, and methylene chloride. This solvent enables the quantum dots 22 to be provided in the form of a suspension. The solvent may only be used during the preparation process, and is not present in the final curable emulsion composition.

(ii) Outer-Phase Composition

The term 'outer-phase composition' refers to a composition that is continuously present outside the curable emulsion composition. The outer-phase composition includes a photocurable polymerization compound and a photoinitiator.

Figure 10:
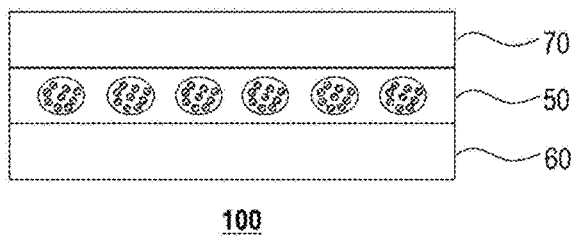
FIG. 10 is a cross-sectional view showing a wavelength conversion sheet according to an embodiment of the present disclosure.

Since the resin constituting the matrix resin 10 has to maintain optical transparency and has to be used in the state of being attached to an additional film (e.g. a barrier film 60, 70 in FIG. 10 due to the properties of the quantum-dot film 50, it has to adhere strongly to an additional film. Hence, a resin satisfying the above properties may be used.

The matrix resin 10 of the present disclosure may be a photocurable resin in which polymerization occurs upon radiation with active energy rays, and may be a hydrophilic resin so as to be suitable for a preparation method using an emulsion, unlike the encapsulation resin 21.

The 'photocurable resin' is a component that is cross-linked due to the formation of radicals in a molecular chain using strong active energy rays such as UV, EB, radioactive rays, etc. After the photoinitiator contained in the adhesive absorbs ultraviolet rays having a wavelength of 200 to 400 nm, thereby indicating reactivity, a monomer, which is the main component of the resin, is allowed to react therewith and polymerized and cured. When the photoinitiator contained in the photocurable resin is irradiated with UV light, a photopolymerization reaction is initiated, so the oligomer and monomer, which are the main components of the resin, are polymerized and cured.

It is preferred that the matrix resin 10 be an acrylic polymer. The acrylic polymer may be prepared through polymerization of at least one selected from the group consisting of an acrylic oligomer, an acrylic monomer and combinations thereof, and the matrix resin 10 obtained after final curing may be an acrylic resin.

The acrylic oligomer may be an epoxy acrylate resin.

The epoxy acrylate resin is a resin in which the epoxide group of the epoxy resin is substituted with an acryl group. For example, the epoxy acrylate resin may be any one selected from the group consisting of bisphenol A glycerolate diacrylate, bisphenol A ethoxylate diacrylate, bisphenol A glycerolate dimethacrylate, bisphenol A ethoxylate dimethacrylate, and combinations thereof. The epoxy acrylate resin has low moisture permeability and air permeability due to the properties of the main chain thereof, like the epoxy resin.

The acrylic monomers capable of being used are not particularly limited in the present disclosure, and any acrylic monomer may be used, so long as it is known in the art. Typically, the acrylic monomer may be at least one selected from the group consisting of an unsaturated-group-containing acrylic monomer, an amino-group-containing acrylic monomer, an epoxy-group-containing acrylic monomer, and a carboxylic-acid-group-containing acrylic monomer, suitable for the preparation of a homopolymer or copolymer.

Examples of the unsaturated-group-containing acrylic monomer may include methyl acrylate, methyl methacrylate, ethyl acrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, cyclohexyl acrylate, cyclohexyl methacrylate, phenyl acrylate, phenyl methacrylate, 2-methoxyethyl acrylate, 2-methoxyethyl methacrylate, 2-phenoxyethyl acrylate, 2-phenoxyethyl methacrylate, methoxydiethyleneglycol acrylate, methoxydiethyleneglycol methacrylate, methoxytriethyleneglycol acrylate, methoxytriethyleneglycol methacrylate, methoxypropyleneglycol acrylate, methoxypropyleneglycol methacrylate, methoxydipropyleneglycol acrylate, methoxydipropyleneglycol methacrylate, isobornyl acrylate, isobornyl methacrylate, dicyclopentadiethyl acrylate, dicyclopentadiethyl methacrylate, 2-hydroxy-3-phenoxypropyl acrylate, 2-hydroxy-3-phenoxypropyl methacrylate, glycerol monoacrylate, glycerol monomethacrylate, and the like.

Examples of the amino-group-containing acrylic monomer may include 2-aminoethyl acrylate, 2-aminoethyl methacrylate, 2-dimethylaminoethyl acrylate, 2-dimethylaminoethyl methacrylate, 2-aminopropyl acrylate, 2-aminopropyl methacrylate, 2-dimethylaminopropyl acrylate, 2-dimethylaminopropyl methacrylate, 3-aminopropyl acrylate, 3-aminopropyl methacrylate, 3-dimethylaminopropyl acrylate, 3-dimethylaminopropyl methacrylate, and the like.

Examples of the epoxy-group-containing acrylic monomer may include glycidyl acrylate, glycidyl methacrylate, glycidyloxyethyl acrylate, glycidyloxyethyl methacrylate, glycidyloxypropyl acrylate, glycidyloxypropyl methacrylate, glycidyloxybutyl acrylate, glycidyloxybutyl methacrylate, and the like.

Examples of the carboxylic-acid-group-containing acrylic monomer may include acrylic acid, methacrylic acid, acryloyloxy acetic acid, methacryloyloxy acetic acid, acryloyloxy propionic acid, methacryloyloxy propionic acid, acryloyloxy butyric acid, methacryloyloxy butyric acid, and the like.

The photoinitiator may be used regardless of the type thereof, so long as it is able to form a radical due to decomposition of a molecule by absorbing light in the ultraviolet range, having a wavelength of 100 nm to 400 nm.

Specifically, the photoinitiator may include a benzoin photoinitiator, a hydroxyketone photoinitiator, an aminoketone photoinitiator or a phosphine oxide photoinitiator. Specific examples thereof may include, but are not limited to, benzoin, benzoin methylether, benzoin ethylether, benzoin isopropylether, benzoin n-butylether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenylketone, methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo [2-hydroxy-2-methyl-1-[4-(1-methylvinyl)phenyl]propanone], and 2,4,6-trimethylbenzoyl-diphenyl-phosphine oxide. These photoinitiators may be used alone or in combinations thereof.

The outer-phase composition further includes a solvent for viscosity control, dissolution of a photoinitiator, and the like. Here, the solvent may be a polar solvent, such as water, methanol, ethanol, propanol, isopropanol, butanol, acetone, dimethylformamide, and the like, and is preferably water. The solvent is used only for dispersion, and is removed through a process such as depressurization, pressurization or heating, and is thus excluded from the final curable emulsion composition.

Also, the outer-phase composition may further include a crosslinking agent for a crosslinking reaction. Specific examples of the crosslinking agent useful in the present disclosure may include ethyleneglycol di(meth)acrylate, polyethyleneglycol di(meth)acrylate containing 2 to 14 ethylene groups, trimethylolpropane di(meth)acrylate, trimethylolpropane tri(meth)acrylate, pentaerythritol tri(meth)acrylate, pentaerythritol tetra(meth)acrylate, 2-trisacryloyloxymethylethylphthalic acid, propyleneglycol di(meth)acrylate, polypropylene glycol di(meth)acrylate containing 2 to 14 propylene groups, dipentaerythritol penta(meth)acrylate, and dipentaerythritol hexa(meth)acrylate. These crosslinking agents may be used alone or in combinations of two or more thereof. The crosslinking agent is preferably used in an amount of 0.5 to 10 wt % based on the total weight of the composition.

(iii) Additional Material

The inner-phase composition and the outer-phase composition of the curable emulsion composition according to the present disclosure may further include various additional materials depending on the purpose thereof.

As an additional material, ceramic nanoparticles may be used for either the inner-phase composition or the outer-phase composition, and are preferably added to the inner-phase composition.

Figure 2:
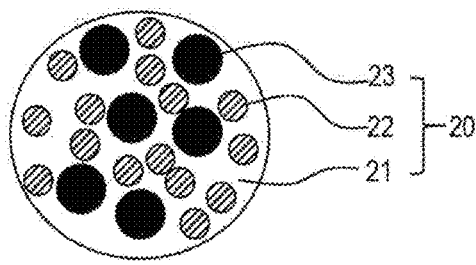
FIG. 2 is a cross-sectional view showing encapsulated quantum-dot particles according to an exemplary embodiment of the present disclosure.

FIG. 2 shows the encapsulated particles 20 according to an exemplary embodiment of the present disclosure, in which quantum dots 22 and ceramic nanoparticles 23 are dispersed in the encapsulated particles 20.

The ceramic nanoparticles 23 may be used along with the quantum dots 22 to thus minimize aggregation of the quantum dots 22. In the case in which a phenomenon of aggregation of the quantum dots 22 occurs, the light emission wavelength and full width at half maximum (FWHM) change. Specifically, when two quantum dots 22 aggregate, the size of the quantum dots 22 may increase corresponding thereto and thus the activity thereof may change. For example, the size of quantum dots 22 that convert blue light into green light is 2 nm to 2.5 nm, and when two green-light quantum dots 22 aggregate, the size of quantum dots 22 is changed to 4 nm to 5 nm, thus increasing the wavelength and FWHM of the converted green light, resulting in inaccurate fluorescence.

Figure 3:
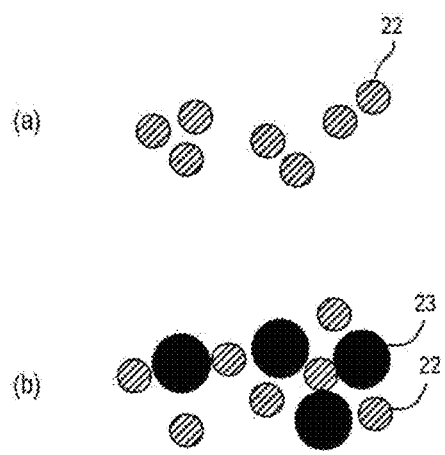
FIG. 3 schematically shows the prevention of aggregation of quantum dots using ceramic nanoparticles.

FIG. 3 schematically shows the prevention of aggregation of quantum dots 22 using ceramic nanoparticles 23. As shown in FIG. 3 (a), the quantum dots 22 are present in an aggregated form, and as shown in FIG. 3 (b) using the ceramic nanoparticles 23, the quantum dots 22 may be spaced apart from each other, with the ceramic nanoparticles 23 interposed therebetween.

Also, the ceramic nanoparticles 23 are capable of dissipating heat generated during the operation of a display or upon emission of light from the quantum dots 22 to the outside (or toward the matrix resin 10), thus preventing deterioration of the quantum dots 22 to thereby increase the reliability of the quantum-dot film 50 and the long-term stability thereof.

Figure 4:
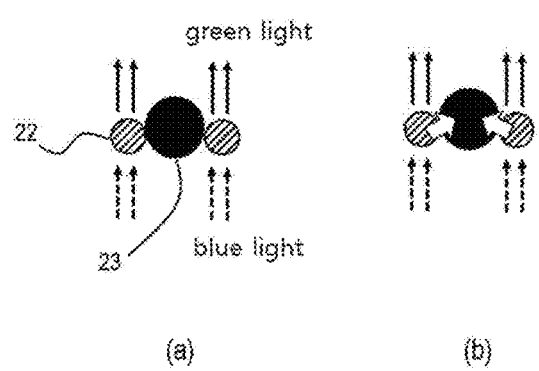
FIG. 4 schematically shows heat absorption by ceramic nanoparticles.

FIG. 4 schematically shows the absorption of heat by the ceramic nanoparticles 23. With reference to FIG. 4 (a), in an exemplary embodiment, green quantum dots 22 are used; when blue light is incident on green quantum dots 22, it is converted into green light to thus emit light. In this procedure, some of the energy of the blue light is converted into heat, so the temperature of the quantum dots 22 rises. As for the quantum dots 22, the change in luminous efficiency depending on the temperature is large. Specifically, when the quantum dots 22 emit light, the luminous efficiency decreases with an increase in the ambient temperature, and conversely, the luminous efficiency increases with a decrease in the temperature. Therefore, it is favorable to lower the temperature in order to increase the luminous efficiency.

As shown in FIG. 4 (b), when the ceramic nanoparticles 23 are used together, the heat generated from the quantum dots 22 is transferred to the ceramic nanoparticles 23 (arrow). Ultimately, the ceramic nanoparticles 23 are capable of absorbing heat generated from the quantum dots 22, thus lowering the temperature of the quantum dots 22, thereby improving stability.

The function of the ceramic nanoparticles 23 as described above differs from that of conventional ceramic particles, which is to increase light conversion efficiency through light scattering.

To realize this effect, the ceramic nanoparticles 23 may be included in at least one of encapsulated particles including the quantum dots 22 and the matrix resin 10, but preferably exhibit the above effects when encapsulated together with the quantum dots 22.

Usable ceramic nanoparticles 23 may be at least one selected from the group consisting of oxides such as silica, alumina, titania, zirconia, tungsten oxide and zinc oxide, and nitrides such as $Si_3N_4$.

The ceramic nanoparticles 23 preferably have an average particle diameter of 5 nm to 450 nm. If the size thereof is less than the above lower limit, particles may aggregate and thus uniform dispersion thereof becomes difficult. On the other hand, if the size thereof exceeds the about upper limit, the relative amount of the quantum dots 22 may decrease, thus lowering the light conversion efficiency of the quantum-dot film 50.

The amount of the ceramic nanoparticles 23 is 100 to 500 parts by weight, and preferably 150 to 400 parts by weight, based on 100 parts by weight of the quantum dots 22. If the amount thereof exceeds the above upper limit, light absorption may increase and thus light conversion efficiency may decrease, or the resulting film may become non-uniform and the transparency thereof may decrease.

As another additional material, a surfactant may be used.

The surfactant is attached to the surface of droplets to prevent coalescence of the droplets and maintain the shape of the droplets. More specifically, one side of the surfactant is located at the surface side of the droplet, which is nonpolar, and the remaining side thereof is disposed at the polar solvent side, so the droplet is surrounded by the surfactant such that the shape of the droplet may be maintained. Meanwhile, the droplet size may be adjusted depending on the concentration of the surfactant, and, for example, the higher the concentration of the surfactant, the smaller the droplet size. The surfactant is preferably a silicone-based surfactant, a fluorine-based surfactant, an ester-based surfactant, a cationic surfactant, an anionic surfactant, a nonionic surfactant, an amphoteric surfactant, and the like, and specific examples thereof may include polyoxyethylene alkyl ethers, polyoxyethylene alkylphenylethers, polyethylene glycol diesters, sorbitan fatty acid esters, fatty acid modified polyesters, tertiary amine modified polyurethanes, polyethyleneimines, etc.

Examples of the silicone-based surfactant may include commercially available products, such as DC3PA, DC7PA, SH11PA, SH21PA, SH8400, etc. made by Dow Corning Toray Silicone Co. Ltd., TSF-4440, TSF-4300, TSF-4445, TSF-4446, TSF-4460, TSF-4452, etc. made by GE Toshiba Silicone Co. Ltd., and the like.

Examples of the fluorine-based surfactant may include commercially available products, such as Megapack F-470, F-471, F-475, F-482, F-489, etc. made by Dai Nippon Ink Chemical Industry Co. Ltd. Other commercially available products may include KP (made by Shin-Etsu Chemical), POLYFLOW (made by Kyoeisha Chemical), EFTOP (made by Tochem Products), MEGAFAC (made by Dai Nippon Ink Chemical Industry), Flourad (made by Sumitomo 3M), Asahi guard and Surflon (made by Asahi Glass), SOL-SPERSE (Lubrisol), EFKA (made by EFKA Chemicals), PB 821 (made by Ajinomoto), Disperbyk series (made by BYK-Chemie), and the like.

Specific examples of the cationic surfactant may include amine salts, such as stearylamine hydrochloride and lauryl trimethylammonium chloride, quaternary ammonium salts, and the like.

Specific examples of the anionic surfactant may include higher alcohol sulfate ester salts such as sodium lauryl alcohol sulfate ester and sodium oleyl alcohol sulfate ester, alkyl sulfates such as sodium lauryl sulfate and ammonium lauryl sulfate, alkylarylsulfonates such as sodium dodecyl benzenesulfonate and sodium dodecyl naphthalenesulfonate, and the like.

Specific examples of the nonionic surfactant may include polyoxyethylene alkyl ether, polyoxyethylene aryl ether, polyoxyethylene alkylaryl ether, other polyoxyethylene derivatives, oxyethylene/oxypropylene block copolymer, sorbitan fatty acid ester, polyoxyethylene sorbitan fatty acid ester, polyoxyethylene sorbitol fatty acid ester, glycerin fatty acid ester, polyoxyethylene fatty acid ester, polyoxyethylene alkylamine, and the like.

These surfactants may be used alone or in combinations of two or more thereof.

As a further additional material, a light-scattering agent may be used. Here, the light-scattering agent may be added to any of the inner-phase composition and the outer-phase composition. In particular, when the light-scattering agent is substantially located only in the inner-phase composition, the scattering effect may be maximized and thus wavelength conversion efficiency may be improved.

In addition thereto, an ultraviolet absorber, a light stabilizer, an antioxidant, an anti-yellowing agent, a bluing agent, a dispersant, a flame retardant, a dye, a filler, an organic or inorganic pigment, a release agent, a fluidity modifier, a leveling agent, an antifoaming agent, a thickener, an anti-settling agent, an antistatic agent, an anti-fogging agent and the like may be appropriately mixed within a range that does not impede the effects of the present disclosure.

Meanwhile, according to another embodiment of the present disclosure, the encapsulated quantum dots 22 may be double-encapsulated using a resin that is the same as or different from the encapsulation resin 21.

Figure 5:
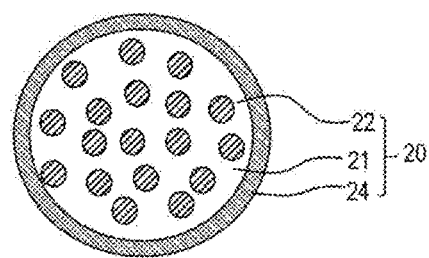
FIG. 5 is a cross-sectional view showing a quantum-dot film including double-encapsulated quantum dots.

FIG. 5 is a cross-sectional view showing the quantum-dot film 50 including double-encapsulated quantum dots 22. With reference to FIG. 5, it can be seen that double-encapsulated quantum dots 22 are uniformly dispersed in the matrix resin 10.

When the encapsulation process using the encapsulation resin 21 is performed once more, as in the case of the double-encapsulated quantum dots 22, the oxidation of quantum dots 22 or the lifting of both ends of the film may be prevented by more effectively blocking moisture or oxygen from the outside, thus increasing the light conversion efficiency of the quantum dots 22 and prolonging the lifetime of the quantum-dot film 50.

The primary encapsulation and secondary encapsulation of the double quantum dots 22 upon encapsulation may be performed using the nonpolar polyolefin-based wax as described above, and the same or a similar resin may be used therefor.

The primary encapsulation and the secondary encapsulation may be carried out using an emulsion composition. Here, the primary encapsulation is performed using an emulsion in which the encapsulation resin 21 and the quantum dots 22 are dispersed in the polar solvent and the secondary encapsulation may be performed using an emulsion including the primarily encapsulated quantum dots 22 according to the present disclosure.

The primary encapsulation and the secondary encapsulation enable the formation of a coating layer, the thickness of which is 0.1 to 10 µm, preferably 0.5 to 5 µm, and the amount of which may be 0.1 to 15 parts by weight, preferably 1 to 5 parts by weight, based on 100 parts by weight of the primary encapsulation resin 21. If the thickness or amount is less than the corresponding lower limit above, the probability that quantum dots are not encapsulated may increase, resulting in poor reliability. On the other hand, if the thickness or amount exceeds the corresponding upper limit above, light emission uniformity may be a wavelength conversion sheet lowered when manufactured using the encapsulated quantum dots is disposed in a display. Hence, the thickness and amount thereof are appropriately set within the above ranges.

The double encapsulation process may be performed using an emulsion composition.

Specifically, a polar solvent is placed in a mixer. Separately, the encapsulation resin 21 and the quantum dots 22 are placed in another mixer to afford a suspension. The suspension is introduced with the polar solvent, and thus phase separation may occur due to polar/nonpolar properties, whereby the nonpolar solvent, the encapsulation resin 21 and the quantum dots 22 are present as a dispersed phase in the continuous-phase polar solvent. Subsequently, the quantum dots 22 are encapsulated through various methods depending on the type of encapsulation resin 21. The encapsulated particles 20 thus obtained are recovered after removal of the solvent, and then further subjected to an encapsulation process using the matrix resin and the encapsulation resin 21.

Figure 6:
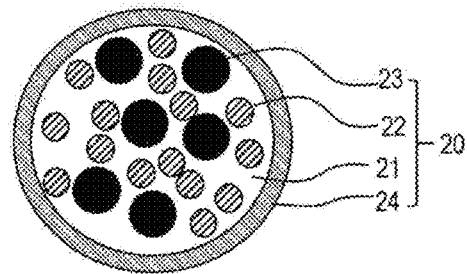
FIG. 6 is a cross-sectional view showing encapsulated quantum-dot particles including ceramic nanoparticles.

Here, double encapsulation may be performed using ceramic nanoparticles 23. FIG. 6 schematically shows the encapsulated particles including quantum dots 22 and ceramic nanoparticles 23. When the ceramic nanoparticles 23 are included in this way, the effects of the use of the ceramic nanoparticles 23 described above may be ensured.

As such, in the preparation method, the quantum dots 22 are used along with the allowable amount of the ceramic nanoparticles 23, and the specific method is dependent on the double encapsulation method described above.

According to an embodiment of the present disclosure, the inner-phase composition includes the quantum dots 22 in an amount of 0.1 to 5 wt %, preferably 0.5 to 3 wt %, and the encapsulation resin 21 in an amount of 0.5 to 25 wt %, preferably 2.5 to 15 wt %, in order to satisfy a total of 100 wt % of the curable emulsion composition, and additionally, each of the crosslinking agent, the crosslinking accelerator, the catalyst and other additives is used in an amount of 0.001 to 10 wt %.

According to an embodiment of the present disclosure, the outer-phase composition includes the photocurable polymerization compound in an amount of 65 to 90 wt %, preferably 75 to 87 wt %, and the photoinitiator in an amount of 0.1 to 2 wt %, preferably 0.5 to 1.5 wt %, in order to satisfy a total of 100 wt % of the curable emulsion composition.

Method of Manufacturing Quantum-Dot Film

Figure 7:
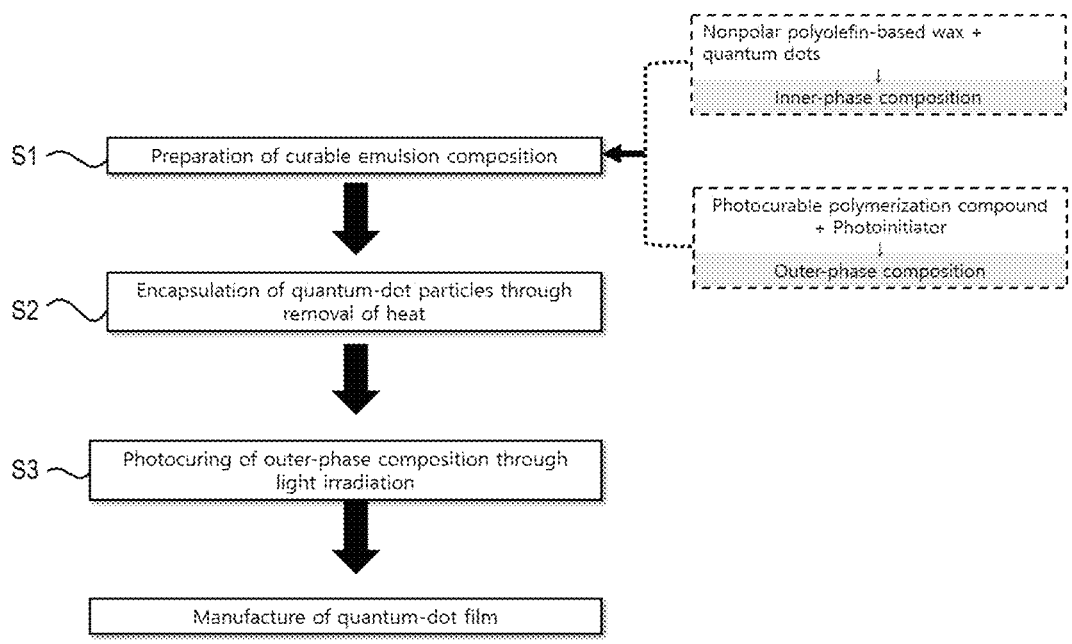
FIG. 7 is a flowchart showing a process of manufacturing a quantum-dot film using a curable emulsion composition according to the present disclosure.

FIG. 7 is a flowchart showing the process of manufacturing a quantum-dot film 50 using the curable emulsion composition according to the present disclosure.

With reference to FIG. 7, the method includes:
(S1) preparing a curable emulsion composition including an inner phase including quantum dots and a nonpolar polyolefin-based wax and an outer phase including a photocurable polymerization compound and a photoinitiator, the inner phase being dispersed in a droplet form in the outer phase;
(S2) encapsulating the quantum dots of the inner phase by cooling the curable emulsion composition to a temperature equal to or lower than the melting point of the nonpolar polyolefin-based wax; and
(S3) curing the outer phase by irradiating the obtained suspension with light.

Encapsulation of the inner phase and curing of the outer phase of the curable emulsion composition are independently performed. Individual steps are specified below.

In the present disclosure, the nonpolar polyolefin-based wax is used, thus increasing resistance to moisture or oxygen in the air to thereby prevent the lifetime and performance from decreasing due to oxidation of the quantum dots.

Figure 8:
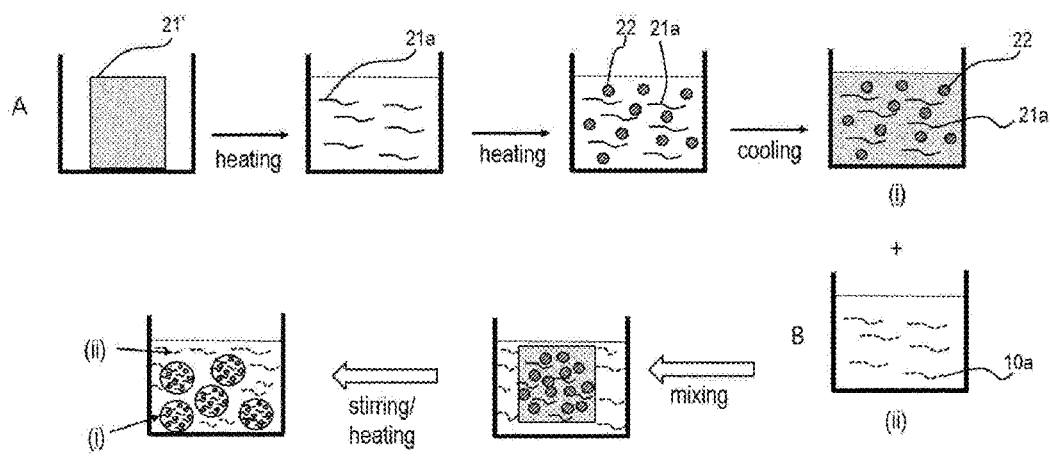
FIG. 8 schematically shows a process of preparing a curable emulsion composition.
Figure 9:
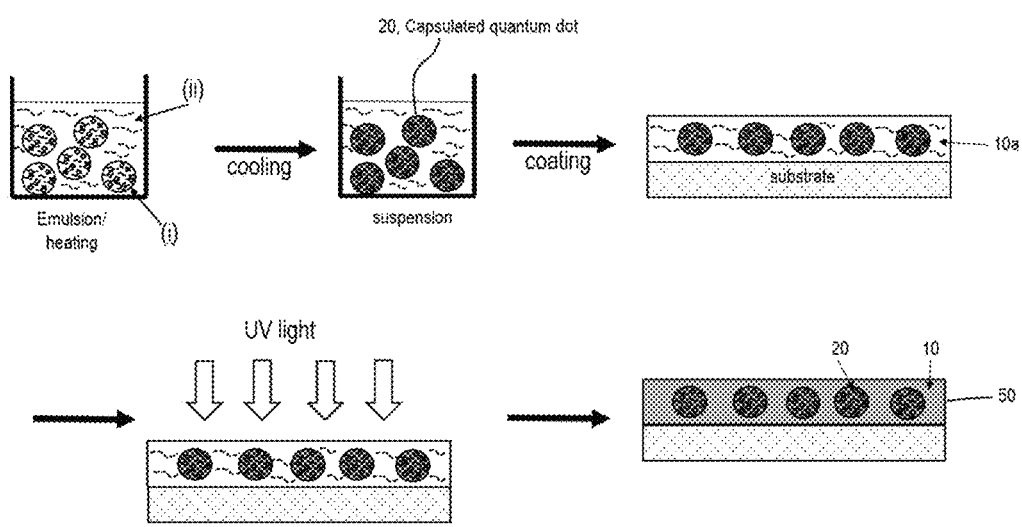
FIG. 9 schematically shows a process of manufacturing a quantum-dot film using the curable emulsion composition.

FIG. 8 schematically shows the preparation of the curable emulsion composition, and FIG. 9 schematically shows the manufacture of the quantum-dot film using the curable emulsion composition. With reference to FIGS. 8 and 9, individual steps are specified below.

(S1) Preparation of Curable Emulsion Composition

First, a solid nonpolar polyolefin-based wax 21' is placed in a mixer A, after which the nonpolar polyolefin-based wax is heated to a temperature equal to or higher than the melting point thereof and thus converted into a liquid encapsulation resin 21a.

The melting point of the nonpolar polyolefin-based wax may vary depending on the type of wax-based compound. For example, low-density polyethylene wax has a melting point of 80 to 140° C., and is liquefied by applying heat at the above temperature.

Conversion into a liquid is performed through the application of heat without a separate stirring process.

Next, the liquid encapsulation resin 21a is added with a predetermined amount of quantum dots 22 and uniformly mixed, thus preparing an inner-phase composition (i). Here, the mixing process is carried out under warm conditions so that the encapsulation resin 21a remains liquid.

The quantum dots 22 are typically provided in the form of being dispersed in an organic solvent, and the solvent may be removed before or after mixing with the encapsulation resin 21a so that the solvent is absent from the inner-phase composition (i). The solvent may be removed through a typical heating or depressurization process.

Here, the stirrer of the mixer A operates so that the quantum dots are uniformly dispersed in the liquid encapsulation resin 21a. Here, the stirring conditions may vary depending on the size of the mixer and the amounts of components in the composition, and stirring may be conducted at about 100 to 5000 rpm. The mixing time is set such that the components are uniformly mixed, and is typically 1 minute to 30 minutes.

Next, the temperature of the mixer is lowered so that the liquid inner-phase composition (i) is solidified. The solidification may be achieved by lowering the temperature of the mixer to a temperature equal to or lower than the melting point of the nonpolar polyolefin-based wax, preferably to room temperature. Here, the quantum dots 22 are uniformly dispersed in the solid encapsulation resin 21a.

The inner-phase composition (i) in a liquid phase may be mixed with the outer-phase composition (ii) to afford a curable emulsion composition, but for convenience in processing, the inner-phase composition may be converted into a solid, which is then applied to the preparation of a curable emulsion composition.

Next, a photocurable polymerization compound and a photoinitiator are placed in a separate mixer B to afford an outer-phase composition (ii).

Here, the mixer B may be a typical emulsification device for the preparation of an emulsion. The emulsification device may be a homogenizer or a sonicator, and is preferably a homogenizer, but the type of emulsification device is not limited in the present disclosure.

The outer-phase composition (ii) is prepared at room temperature, and stirring is performed for uniform mixing thereof. Here, the stirring conditions may vary depending on the size of the mixer and the amounts of components in the composition, and stirring may be conducted at about 100 to 5000 rpm. The mixing time is set so that the components are uniformly mixed, and is typically 1 minute to 30 minutes.

Next, the inner-phase composition (i) is added to the outer-phase composition (ii), after which the mixer B is warmed, so the nonpolar polyolefin-based wax in the inner-phase composition (i) is melted.

The warming process is performed at a temperature equal to or higher than the melting point of the nonpolar polyolefin-based wax, whereby the nonpolar polyolefin-based wax is converted into a liquid, so the liquid inner-phase composition (i) and the outer-phase composition (ii) are phase-separated due to a difference in hydrophobicity/hydrophilicity, thus preparing a curable emulsion composition in which the inner-phase composition (i) is present in the form of droplets.

The curable emulsion composition thus prepared is configured such that the inner-phase composition (i) is present in the form of droplets having a size of 0.1 (m to 100 μm and preferably 1 mm to 10 μm and the outer-phase composition (ii) is present in a continuous phase.

Here, the droplet size may be controlled by adjusting the amount ratio of the inner-phase composition (i) and the outer-phase composition (ii). Preferably, the inner-phase composition (i) and the outer-phase composition (ii) are mixed at a weight ratio of about 0.1:99.9 to 20:80, and preferably about 10:90 to 5:95. When the mixing ratio falls out of the above range, the droplets may not be formed, or the distance between quantum dots 22 may decrease, and thus dispersion may be impeded and light conversion efficiency may decrease.

Also, the droplet size may be controlled using a surfactant. As a usable surfactant, the surfactant described above may be used, and the surfactant may be used in a manner of being added either to the process of preparing the inner-phase composition (i) or to the process of preparing the outer-phase composition (ii).

The curable emulsion composition obtained above is maintained in the state of being warmed to a temperature equal to or higher than the melting point of the nonpolar polyolefin-based wax so that the nonpolar polyolefin-based wax remains liquid.

(S2) Encapsulation of Quantum Dots of Inner Phase

The temperature of the curable emulsion composition obtained in (S1) is lowered so that the nonpolar polyolefin-based wax is solidified, thus encapsulating the quantum dots 22 of the inner phase with the nonpolar polyolefin-based wax.

Here, the cooling rate is adjusted by slowly or rapidly decreasing the temperature of the mixer to room temperature. When the cooling rate is high, particularly when the temperature of the liquid nonpolar polyolefin-based wax is rapidly lowered, the size of the encapsulated particles 20 formed using the nonpolar polyolefin-based wax may be decreased. On the other hand, when the above temperature is slowly lowered, the size of the encapsulated particles 20 may be increased. Typically, the cooling process is performed at a rate of 0.1° C. to 2° C. per minute, thereby stably manufacturing encapsulated particles 20 on the micrometer scale.

After completion of the cooling, the curable emulsion composition is obtained in the form of a suspension in which the encapsulated particles 20 are dispersed in the outer-phase composition (ii).

In the emulsion state, encapsulation occurs only within the droplets, and consequently, one encapsulated particle 20 may be obtained from one droplet to afford encapsulated particles 20 on the micrometer scale. These encapsulated particles 20 are manufactured through continuous mixing, and individual particles 20 are independently present without aggregating.

The suspension is subjected to a subsequent process without additional post-treatment.

(S3) Photocuring of Outer Phase

Next, the suspension obtained in (S2) is irradiated with light, thus photocuring the outer phase.

Here, in order to manufacture a film, the suspension is applied on a substrate to form a coating film, which is then irradiated with light.

The substrate may be a glass substrate or a plastic substrate. Preferably, a plastic substrate, and more preferably a barrier film 60, 70 (FIG. 10), is used, as will be described later. Alternatively, the substrate may be a plate-type substrate, a tube-type substrate, or a substrate having a light-emitting diode mounted thereon, but the present disclosure is not limited thereto.

The coating process is not particularly limited in the present disclosure, and a known wet coating process may be performed. Examples of the coating process for forming a thin uniform coating film may include, but are not necessarily limited to, dip coating, flow coating, spray coating, roll coating, spin coating, and gravure coating. The thickness of the coating film in the coating process may be determined in consideration of a reduction in the thickness of the coating film after drying and after photocuring, and is set to 1.5 to 5 times the final thickness. Accordingly, the coating process may be performed one or more times.

The drying process may be performed using any process typically known in the art. The drying process may be conducted through hot-air heating or induction heating, but is not limited thereto. When a hot-air heating process is performed, the above composition may be dried through hot-air treatment at 40 to 80° C. for 10 to 50 seconds. An induction heating process may be performed in the frequency range of 1 to 50 MHz at a power of 1 to 15 KW for 5 to 20 seconds. When drying is performed in this way, the water or solvent may be completely removed from the outer-phase composition (ii). The water or solvent may deteriorate the properties of the quantum-dot film 50.

The dried coating film has a structure configured such that the encapsulated quantum-dot particles 20 are uniformly dispersed in the matrix resin 10a in the outer-phase composition (ii).

The coating film is irradiated with light, whereby the outer-phase composition (ii) is photocured to afford a matrix resin 10, ultimately obtaining a quantum-dot film 50.

Photocuring is performed in a manner in which active energy is emitted from a light source and is radiated onto the coating film.

Examples of the light source may include light rays such as far-ultraviolet rays, ultraviolet rays, near-ultraviolet rays, infrared rays, and the like, electromagnetic waves such as X-rays, y-rays, and the like, electron beams, proton rays, neutron beams, etc. Using ultraviolet irradiation for curing is advantageous in view of the curing speed, the availability of irradiation devices, the price, and the like.

As a light source used for ultraviolet irradiation, a high-pressure mercury lamp, an electrodeless lamp, an ultra-high-pressure mercury lamp, a carbon arc lamp, a xenon lamp, an LED lamp, a metal halide lamp, a chemical lamp, a black light, etc. may be used. For example, a high-pressure mercury lamp may be used under conditions of about 5 mJ/cm$^2$ to about 3000 mJ/cm$^2$, particularly about 400 mJ/cm$^2$ to about 1500 mJ/cm$^2$.

Moreover, the irradiation time varies depending on the type of light source, the distance between the light source and the coating film, the thickness of the coating film, and other conditions, but the irradiation time typically falls in the range from ones of seconds to tens of seconds, and in some cases may be one second.

The quantum-dot film 50 manufactured as described above is configured such that the encapsulated particles 20, in which the quantum dots 22 are encapsulated with the encapsulation resin 21, such as the nonpolar polyolefin-based wax, are uniformly dispersed in the matrix resin 10, as shown in FIG. 1.

In the present disclosure, the curable emulsion composition is prepared using the emulsion, thus solving problems with conventional preparation processes in which quantum dots 22 aggregate, thereby making it possible to stably manufacture a quantum-dot film 50 in which the quantum dots 22 are uniformly dispersed at a high concentration in the matrix resin 10.

In particular, the droplets, which are the inner phase in the curable emulsion composition, are solidified without change, so the size of the encapsulated particles 20 may become constant and a very narrow particle size distribution may result. This method contrasts with conventional cases in which encapsulated particles are manufactured separately. Specifically, when the encapsulated particles are manufactured separately, the quantum dots 22 may aggregate, and thus the size of the encapsulated particles may fall in the range from ones to thousands of micrometers, and thus a wide particle size distribution may result. Typically, the particle size distribution is directly associated with the dispersion of the quantum dots in the quantum-dot film, and also with the overall light conversion efficiency of quantum dots. When the quantum dots are uniformly distributed in the matrix resin, the light conversion efficiency of quantum dots throughout the film may become uniform.

Also, the encapsulation of the quantum dots 22 and the preparation of the matrix resin 10 (photocuring) may be performed without separate treatment of the curable emulsion composition, and thus the manufacturing process may become very simple, and it is easy to apply a roll-to-roll process for mass production of the quantum-dot film 50.

A conventional method for encapsulation of quantum dots using a wax-based compound and photocuring to prepare a matrix resin is proposed. This method is performed in a manner in which the quantum dots are encapsulated in a solvent, rather than in an emulsion, and are then dried to obtain encapsulated particles, which are then added to a photocurable composition. Thereby, the preparation process essentially requires the use of a solvent that is otherwise unnecessary for the process, followed by drying and recovery of particles, undesirably increasing processing costs and complicating the preparation process.

Moreover, in the present disclosure, encapsulation of the quantum dots 22 and preparation of the matrix resin 10 through photocuring are independently performed, thus increasing the encapsulation quality of the encapsulated particles 20 and the quality of the matrix resin 10. Conventionally, a technique for manufacturing a quantum-dot film by performing ultraviolet curing once using an emulsion composition is performed, but is problematic because coalescence between droplets occurs, making it impossible to stably encapsulate the quantum dots. Therefore, in the present disclosure, the quantum dots 22 may be stably encapsulated by independently performing encapsulation and photocuring.

In particular, the above conventional method is limited with regard to the maximum amount of encapsulated particles in the matrix resin in consideration of the dispersion stability of the composition. However, when the method using the emulsion is performed, as in the present disclosure, the overall droplet size is uniform and high dispersion stability may result, so the amount of the encapsulated particles 20, particularly the amount of the quantum dots 22 present in the matrix resin 10, may be effectively increased.

The quantum-dot film 50 manufactured according to the present disclosure includes, based on 100 parts by weight of the matrix resin 10, 0.5 to 20 parts by weight, preferably 1 to 10 parts by weight, of the encapsulated particles including the quantum dots 22. Also, in the encapsulated particles 20, the amount of the quantum dots 22 is 0.1 to 10 parts by weight, and the amount of the encapsulation resin 21 is 0.1 to 20 parts by weight, preferably 0.5 to 10 parts by weight.

The amount ratio of the matrix resin 10, quantum dots 22 and encapsulation resin 21 is set in consideration of uniform dispersion and light conversion efficiency of the quantum dots 22 and the properties of the quantum-dot film 50, such as optical transparency, strength, etc. If the amount of the quantum dots 22 is less than the above lower limit, the light conversion effect may become insignificant, and thus low light conversion efficiency may result. On the other hand, if the amount thereof is too excessive, uniform dispersion may become difficult. Also, if the amount of the encapsulation resin 21 is less than the above lower limit, it is difficult to sufficiently encapsulate the quantum dots 22. On the other hand, if the amount thereof exceeds the above upper limit, the transparency of the quantum-dot film 50 may decrease.

Also, the wavelength conversion film 50 according to the present disclosure has a thickness of 50 to 300 μm, preferably 70 to 180 μm. In particular, the use of a hydrophobic resin as the encapsulation resin 21 is effective at protecting the quantum dots 22 from moisture and air. Moreover, an acrylic resin serving as the matrix resin 10 may exhibit good adhesion to a substrate or a barrier film, which will be described later, and is thus effective at preventing penetration of moisture or oxygen from the outside, thereby preventing oxidation of the quantum dots 22. Furthermore, the encapsulated particles 20, particularly the quantum dots 22, may be dispersed in a large amount (i.e. a high concentration) of 0.1 to 10 parts by weight, preferably 0.5 to 2 parts by weight, in the matrix resin 10, thereby further increasing light conversion efficiency.

The quantum-dot film 50 is applicable to a wavelength conversion sheet for a display, and is capable of realizing a screen having a wide color gamut.

Wavelength Conversion Sheet

The quantum-dot film 50 according to the present disclosure may be used as a wavelength conversion sheet.

As used herein, the wavelength conversion sheet is a film that is able to convert the wavelength of light emitted from a light source. For example, when the light source emits blue light having a wavelength of about 430 nm to about 470 nm, the blue light may be converted into green light having a wavelength of about 520 nm to about 560 nm and/or red light having a wavelength of about 600 nm to about 660 nm.

FIG. 10 is a cross-sectional view showing the wavelength conversion sheet according to an embodiment of the present disclosure. With reference to FIG. 10, the wavelength conversion sheet 100 is configured such that a quantum-dot film 50 is interposed between a first barrier film 60 and a second barrier film 70.

The first barrier film 60 and the second barrier film 70 function to support and protect the quantum-dot film 50, and more specifically to prevent the quantum dots 22 from being oxidized due to penetration of moisture or oxygen in external air into the quantum-dot film 50.

Each of the first barrier film 60 and the second barrier film 70 may include a single material or a composite material acting as a strong barrier to moisture and/or oxygen. For example, the first barrier film and the second barrier film may include a polymer acting as a strong barrier to moisture and/or oxygen, for example, polyethylene, polypropylene, polyvinyl chloride, polyvinylalcohol, ethylene vinyl alcohol, polychlorotrifluoroethylene, polyvinylidene chloride, nylon, polyaminoether, or a cyclic olefin homopolymer or copolymer.

The first barrier film 60 and the second barrier film 70 are depicted in a monolayer form in the drawing, but are not limited thereto. The first barrier film 60 and the second barrier film 70 may be provided in a multilayer form. For example, the first barrier film 60 and the second barrier film 70 may have a laminate structure including a base substrate and a protective layer formed on the base substrate.

For example, the first barrier film 60 and the second barrier film 70 may be provided in a form in which the base substrate is coated with an inorganic layer or an organic-inorganic hybrid layer acting as a strong barrier to moisture and/or oxygen. Here, the inorganic layer or the organic-inorganic hybrid layer may be composed mainly of Si or Al oxide or nitride. As such, the base substrate may be a polymer film having high light transmittance and heat resistance, for example, a polymer film including polyethylene terephthalate (PET), polyethylene naphthalate (PEN), cyclic olefin copolymer (COC), cyclic olefin polymer (COP), etc.

Preferably, the first barrier film 60 and the second barrier film 70 have moisture permeability of about $10^{-1}$ g/m$^2$/day to $10^{-3}$ g/m$^2$/day under conditions of 37.8° C. and 100% relative humidity, and air permeability of about $10^{-1}$ cc/m$^2$/day/atm to $10^{-2}$ cc/m$^2$/day/atm under conditions of 23° C. and 0% relative humidity.

Also, the first barrier film 60 and the second barrier film 70 preferably have a linear transmittance of about 88% to 95% in the visible light range of 420 nm to 680 nm.

The wavelength conversion sheet 100 according to the present disclosure may be manufactured using the aforementioned curable emulsion composition between the first barrier film 60 and the second barrier film 70. Here, the wavelength conversion sheet 100 may be manufactured using any one of the three methods depending on the type of the encapsulation resin 21 of the inner-phase composition.

For example, the method of manufacturing the wavelength conversion sheet according to the present disclosure includes:

(S1) manufacturing encapsulated particles 20 by lowering the temperature of an inner-phase composition, (S2) forming a coating film by applying a composition in which the encapsulated particles 20 are dispersed on any one film of the first barrier film and the second barrier film, (S3) disposing the remaining one of the first barrier film and the second barrier film on the coating film, and (S4) manufacturing a quantum-dot coating layer 50 by curing the coating film through light irradiation, thereby manufacturing a wavelength conversion sheet 100 including the first barrier film 60, the quantum-dot coating layer 50 and the second barrier film 70, which are laminated.

The wavelength conversion sheet 100 thus manufactured has a total thickness of 70 μm to 300 μm and a haze of 5% to 45%.

Display

Since quantum dots are capable of emitting light, the wavelength conversion sheet of the present disclosure is applicable to a display.

A display such as a liquid crystal display (LCD) is capable of exhibiting high luminance and a high color gamut using light emission. Accordingly, for an LCD panel, the wavelength conversion sheet may be applied to a backlight unit (BLU). In an LCD panel having a general structure, about ⅔ of the light emitted from a backlight unit (BLU) is absorbed by a color filter, so light conversion efficiency is poor.

Therefore, in a display using QDs in which the wavelength conversion sheet of the present disclosure is applied to an LCD panel and a backlight unit, quantum dots in the film are capable of converting blue light, which is the backlight, into green and red light, and some of the blue light is transmitted to thus generate white light having high color purity, thereby realizing high luminance and a wide color gamut. Moreover, the viewing angle is increased due to the isotropic light emission properties of the quantum dots, and the thickness of the liquid crystal may be reduced, thereby improving the response speed thereof.

The display is not particularly limited in the present disclosure, and is applicable to a backlight unit (BLU) for display devices such as TV sets, monitors, tablets, smartphones, personal digital assistants (PDAs), gaming devices, electronic reading devices or digital cameras.

Moreover, the wavelength conversion sheet of the present disclosure may be used for indoor or outdoor lighting, stage lighting, decorative lighting, accent lighting or museum lighting, and may also be used in special wavelength lighting required in horticulture or biology, but the range of applications to which the lighting device may be applied is not limited to the foregoing.

MODE FOR INVENTION

EXAMPLES

A better understanding of the present disclosure will be given through the following examples. However, these examples are merely set forth to illustrate the present disclosure, and are not to be construed as limiting the scope of the present disclosure.

Examples 1 to 5 and Comparative Examples 1 to 3

(1) Preparation of Curable Emulsion Composition g of toluene was placed in a 10 ml glass bottle, and 25 mg of polyolefin-based wax and 0.06 ml of a quantum-dot suspension were then added thereto, after which the toluene was removed to afford an inner-phase composition. The quantum-dot suspension was prepared by dispersing CdSe-based quantum dots having octadecylamine as a capping layer (Nanodot-HE, made by Ecoflux, Korea) at a concentration of 20 mg/ml in toluene.

A photocurable resin solution in which a UV-curing initiator (Irgacure 184) was dispersed in 0.5 g of a urethane acrylate oligomer was prepared. The inner-phase composition was mixed with the photocurable resin solution, after which the solvent was thoroughly removed using a decompression rotary evaporator, thereby preparing a coating solution.

(2) Manufacture of Wavelength Conversion Sheet

The curable emulsion composition prepared above was heated to 100-110° C. with stirring at 100 rpm until it became clear, and was then cooled to room temperature, whereby the polyethylene wax of the inner phase was solidified to afford a suspension in which the encapsulated quantum-dot particles were dispersed.

The suspension was applied between a first barrier film (made by i-Components, 50 μm) and a second barrier film (made by i-Components, 50 μm) of a PET substrate, and the resulting coating film was exposed to UV at 1000 mJ/cm² for 1 minute and cured, thus manufacturing a wavelength conversion sheet. Here, the thickness of the quantum-dot film including the encapsulated quantum-dot particles was 80 μm.

The substituent and the degree of substitution of the polyolefin-based wax used in Examples and Comparative Examples are shown in Table 1 below. Here, C1 is a methyl group, and C6 includes all alkyl groups having 6 carbon atoms, such as a hexyl group, a 1-methyl-pentyl group, a 2-methyl-pentyl group, a 1-ethyl-butyl group, a 2-ethyl-butyl group, and the like. Also, C3, C10 and C18 may all be linear or branched alkyl groups having respective numbers of carbon atoms.

TABLE 1

| | —[CH$_2$—CH$_2$]$_a$—[CH$_2$—CHR$_1$]$_b$— (a + b = 1) | | |
|---|---|---|---|
| | R$_1$ | a | b |
| Example 1 | C1 | 0.90 | 0.10 |
| Example 2 | C6 | 0.95 | 0.05 |
| Example 3 | C10 | 0.97 | 0.03 |
| Example 4 | C3, C6 mixed | 0.75 | 0.25 |
| Example 5 | C1 | 0.10 | 0.90 |
| Comparative Example 1 | H | 0.50 | 0.50 |
| Comparative Example 2 | C18 | 0.98 | 0.02 |
| Comparative Example 3 | COOH | 0.95 | 0.05 |

Comparative Example 4

(1) Photocurable Colloid Composition 100 ml of toluene was mixed with 5 g of polyethylene wax (Licowax PED 136, made by Clariant, Switzerland) as a wax-based compound, and the temperature was raised to about 110° C. and thus the polyethylene wax was melted, thereby preparing a wax solution. A solution of about 20 mg of CdSe-based quantum dots (Nanodot-HE, made by Ecoflux, Korea) dispersed in 1 ml of toluene was added to the wax solution, mixed, and cooled to room temperature, thereby preparing a solution in which encapsulated green quantum dots were dispersed.

The solution thus obtained was mixed with urethane acrylate available from BASF (Germany) and a photoinitiator (diphenyl(2,4,6-trimethylbenzoyl) phosphine oxide (TPO)). TPO was mixed in an amount of about 0.8 parts by weight based on 100 parts by weight of urethane acrylate. Thereafter, toluene was removed using an evaporator, thus preparing a coating composition in which the urethane acrylate, the encapsulated quantum dots and the photoinitiator were mixed.

Here, the coating composition included about 5 parts by weight of the encapsulated quantum dots based on 100 parts by weight of the urethane acrylate.

(2) Manufacture of Wavelength Conversion Sheet

The coating composition in which the urethane acrylate, the encapsulated quantum dots and the photoinitiator were mixed was applied to a thickness of about 80 μm on a first barrier film (made by i-Components, Korea), thus forming a coating layer.

A second barrier film, which is substantially the same as the first barrier film, was prepared, and the coating layer was covered with the second barrier film so as to come into contact therewith, and irradiated with UV light to cure the coating layer, thereby forming a wavelength conversion sheet.

Test Example 1: Evaluation of Dispersion Stability

The dispersion stability of the curable emulsion compositions prepared in Examples and Comparative Examples was measured as follows.

The dispersion stability was determined in a manner in which transmittance (transmittance immediately after dispersion) was measured immediately after preparing the curable emulsion compositions of Examples and Comparative Examples using a Cary-4000 transmittance meter (made by Agilent, USA), and transmittance (transmittance after 1 month) was also measured after allowing the same to stand at room temperature for 1 month, and the difference therebetween was calculated.

Transmittance difference (%)=transmittance immediately after dispersion (%)−transmittance after1month (%)  (Equation 1)

The transmittance difference is related to dispersion stability, and when dispersion stability is poor, precipitation occurs over time, whereby transmittance increases, and consequently, the transmittance difference is the lower the transmittance large. Specifically, difference, the higher the dispersion stability, and the higher the transmittance difference, the lower the dispersion stability.

TABLE 2

| Classification | Transmittance difference (%) |
| --- | --- |
| Example 1 | 8.4 |
| Example 2 | 3.2 |
| Example 3 | 7.5 |
| Example 4 | 5.1 |
| Example 5 | 7.9 |
| Comparative Example 1 | 9.8 |
| Comparative Example 2 | 12.3 |
| Comparative Example 3 | 15.1 |

As is apparent from Table 2, the curable emulsion compositions of Examples 1 to 5 according to the present disclosure exhibited low differences in transmittance, and thus there was almost no precipitation or aggregation over time, thereby demonstrating superior dispersion stability. In contrast, the compositions of Comparative Examples 1 and 2 exhibited a transmittance difference about five times that of Example 3, indicating low dispersion stability.

Also, in Examples 1 to 5, compared to Comparative Example 1, when some hydrogen atoms were substituted with alkyl groups, the transmittance was improved, and compared to Comparative Example 2, even upon substitution with alkyl groups, the transmittance was decreased in the case of C18.

Test Example 2: Dispersion of Encapsulated Quantum-Dot Particles

In order to evaluate the extent of dispersion of quantum dots in the wavelength conversion sheet, the wavelength conversion sheet manufactured in each of Example 2, Example 4 and Comparative Example 3 was measured using a fluorescence microscope. The results thereof are shown in FIGS. 11 to 13.

Figure 11:
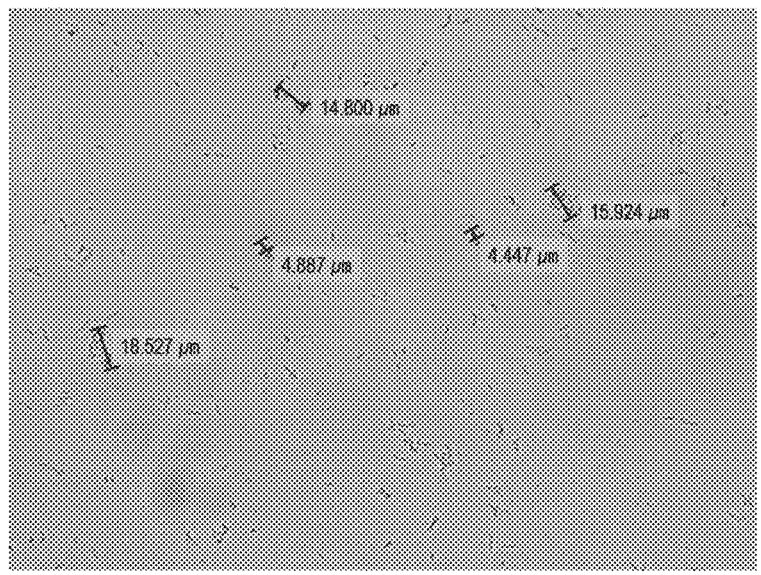
FIGS. 11, 12 and 13 show fluorescence microscope images of the wavelength conversion sheets manufactured in Example 2, Example 4 and Comparative Example 3, respectively.
Figure 12:
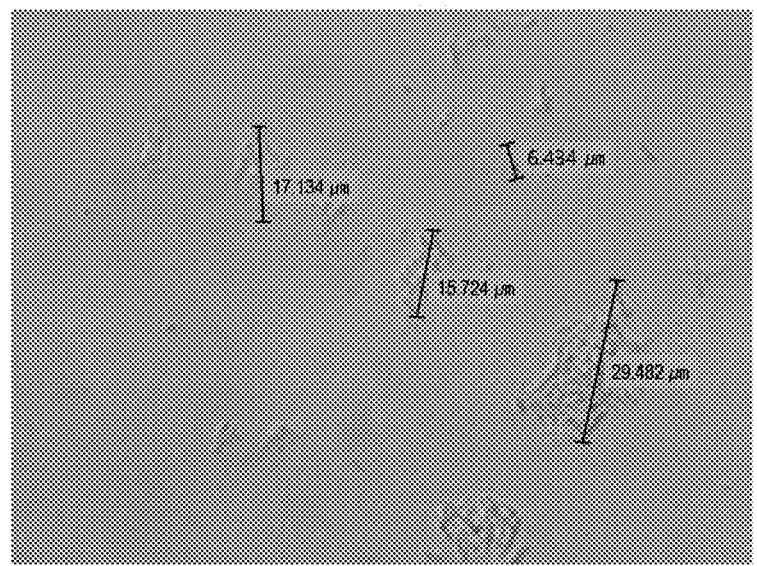
Figure 13:
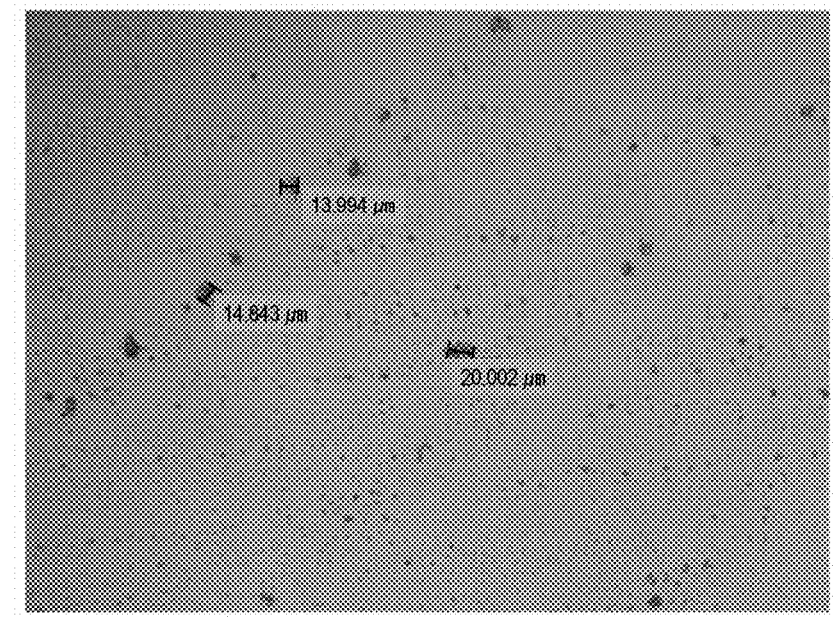

FIGS. 11, 12, and 13 show fluorescence microscope images of the wavelength conversion sheets manufactured in Example 2, Example 4, and Comparative Example 3, respectively. With reference to FIGS. 11 to 13, it can be seen for the sheets of Examples 2 and 4 that the quantum dots were uniformly distributed without aggregation in the direction of coating of the barrier film. In contrast, aggregation of quantum dots occurred in the wavelength conversion sheet of Comparative Example 3.

Based on these results, the wavelength conversion sheet manufactured according to the present disclosure exhibited substantially uniform optical properties throughout the sheet, particularly a wavelength conversion effect, resulting in superior light conversion efficiency.

Test Example 3: Measurement of Quantum Yield

The quantum yield (QY) of the wavelength conversion sheets manufactured in Examples and Comparative Examples measured using an absolute quantum yield spectrometer (C9920-02, made by HAMAMATSU, Japan). The results of measurement thereof are shown in Table 3 below.

TABLE 3

| Classification | Quantum yield (%) |
| --- | --- |
| Example 1 | 89.2 |
| Example 2 | 94.5 |
| Example 3 | 89.9 |
| Example 4 | 92.7 |
| Example 5 | 89.7 |
| Comparative Example 1 | 88.1 |
| Comparative Example 2 | 85.4 |
| Comparative Example 3 | 83.2 |
| Comparative Example 4 | 82.8 |

As is apparent from Table 3, the quantum yield of the wavelength conversion sheets manufactured according to the present disclosure was high compared to the wavelength conversion sheets of Comparative Examples 1 and 2.

The quantum yield is related to compatibility between the matrix and the quantum dots. In the case in which the quantum dots in the matrix are aggregated, a quenching effect is caused by the aggregation phenomenon, undesirably lowering the quantum yield. The low quantum yield decreases color purity, making it difficult to realize a desired color upon application to a display. Therefore, the wavelength conversion sheets manufactured in Examples 1 to 4 according to the present disclosure were capable of exhibiting a high quantum yield of 85% or more because the quantum dots were uniformly distributed throughout the matrix without aggregation, and achieving high color purity when applied to a display.

Also, in Examples 1 to 4, compared to Comparative Examples 1 and 2, when some hydrogen atoms were substituted with alkyl groups and the number of substituted alkyl groups increased, the quantum yield was further improved in the case in which the carbon number of the substituted alkyl groups was limited.

Test Example 4: Reliability

The optical properties of the wavelength conversion sheets manufactured in Examples and Comparative Examples were measured.

In a display configured such that a wavelength conversion sheet was disposed on a light-emitting diode package including a blue-light-emitting diode and such that two films including a luminance enhancement film (brightness enhancement film (BEF), made by 3M) and a reflective polarizer film (dual brightness enhancement film (DBEF), made by 3M) were disposed on the wavelength conversion sheet, CIE 1931 color coordinates and luminance were measured using a spectroradiometer (CS-2000, made by KONICA MINOLTA, Japan).

Subsequently, the color coordinates and luminance were measured again under the following reliability conditions, and the difference thereof was calculated. Reliability conditions:high temperature (85° C.), high-temperature/high-humidity (65° C./95% RH) @ 1,000 hr some hydrogen atoms exhibited superior color coordinates and luminance, unlike the wax of Comparative Example 1 composed of only hydrogen. In addition, compared to Comparative Example 2, even upon substitution with alkyl groups, the properties of the wavelength conversion sheet could be improved only in the case in which the carbon number was limited.

In contrast, the wavelength conversion sheet of Comparative Example 3 exhibited a significant change in color coordinates of −0.022 and −0.029 (x, y), and the luminance was also significantly decreased by 15% or more. Based on these results, the wavelength conversion sheet of Comparative Example 3 was decreased in luminance and could not satisfactorily display a desired color because the quantum dots were oxidized due to moisture and oxygen from the outside during the reliability test.

INDUSTRIAL APPLICABILITY

A quantum-dot film and a wavelength conversion sheet including the same according to the present disclosure are applicable to a display.

The invention claimed is:

1. A method of manufacturing a quantum-dot film, suitable for manufacturing a quantum-dot film in which encapsulated particles obtained by encapsulating quantum dots with an encapsulation resin are dispersed in a matrix resin, the method comprising:
preparing a curable emulsion composition comprising an inner phase comprising quantum dots and a nonpolar polyolefin-based wax and an outer phase comprising a photocurable polymerization compound and a photoinitiator, the inner phase being dispersed in a droplet form in the outer phase;
encapsulating the quantum dots of the inner phase by cooling the curable emulsion composition to a temperature equal to or lower than a melting point of the nonpolar polyolefin-based wax; and
curing the outer phase by irradiating an obtained suspension with light,

TABLE 4

| | Initial (0 hr) | | | Final (1,000 hr) | | | Δ | | |
|---|---|---|---|---|---|---|---|---|---|
| | Color ordinates (CIE1931) | | Luminance | Color ordinates (CIE1931) | | Luminance | Color ordinates (CIE1931) | | Luminance Drop |
| | x | Y | (nit) | x | y | (nit) | x | Y | (%) |
| Example 1 | 0.222 | 0.181 | 8502 | 0.205 | 0.169 | 7813 | −0.017 | −0.012 | 8.1 |
| Example 2 | 0.221 | 0.185 | 8534 | 0.212 | 0.176 | 8107 | −0.009 | −0.009 | 5.0 |
| Example 3 | 0.226 | 0.183 | 8505 | 0.211 | 0.170 | 7855 | −0.015 | −0.013 | 7.6 |
| Example 4 | 0.219 | 0.185 | 8512 | 0.210 | 0.171 | 7910 | −0.009 | −0.014 | 7.1 |
| Example 5 | 0.226 | 0.181 | 8501 | 0.213 | 0.166 | 7832 | −0.013 | −0.015 | 7.9 |
| Comparative Example 1 | 0.225 | 0.186 | 8492 | 0.212 | 0.169 | 7708 | −0.019 | −0.018 | 9.2 |
| Comparative Example 2 | 0.231 | 0.178 | 8489 | 0.209 | 0.161 | 7530 | −0.022 | −0.017 | 11.3 |
| Comparative Example 3 | 0.218 | 0.179 | 8481 | 0.196 | 0.150 | 7219 | −0.022 | −0.029 | 14.9 |

As is apparent from Table 4, when the wavelength conversion sheet of each of Examples 1 to 4 according to the present disclosure was mounted, changes in the CIE 1931 color coordinates were not great after the reliability test, and the decrease in the luminance was also low.

In Examples 1 to 4, compared to Comparative Example 1, the polyethylene wax containing alkyl groups substituted for wherein the nonpolar polyolefin-based wax has a repeating structure of each of Chemical Formula 1 and Chemical Formula 2 below:

$$-[CH_2-CH_2]_a- \qquad \text{[Chemical Formula 1]}$$

$$-[CH_2-CHR_1]_b- \qquad \text{[Chemical Formula 2]}$$

(in Chemical Formulas 1 and 2, $R_1$ is a C1-C15 linear or branched alkyl group, $0.01 \leq b \leq 0.96$, a+b=1).

2. The method of claim 1, wherein the nonpolar polyolefin-based wax has a weight average molecular weight of 300 to 30,000.

3. The method of claim 1, wherein the nonpolar polyolefin-based wax has a melting point of 40 to 180° C.

4. The method of claim 1, wherein the nonpolar polyolefin-based wax is at least one selected from the group consisting of high-density polyethylene (HDPE) wax, low-density polyethylene (LDPE) wax, linear low-density polyethylene (LLDPE) wax, and combinations thereof.

5. The method of claim 1, wherein the inner phase is manufactured by mixing the nonpolar polyolefin-based wax with the quantum dots at a temperature equal to or higher than the melting point of the nonpolar polyolefin-based wax.

6. The method of claim 1, wherein the photocurable polymerization compound is any one selected from the group consisting of an acrylic oligomer, an acrylic monomer, and combinations thereof.

7. The method of claim 1, wherein the photoinitiator is at least one selected from the group consisting of a benzoin photoinitiator, a hydroxyketone photoinitiator, an aminoketone photoinitiator, and a phosphine oxide photoinitiator.

8. The method of claim 1, wherein at least one of the inner phase and the outer phase in the curable emulsion composition further comprises any one selected from the group consisting of ceramic nanoparticles, a crosslinking agent, a catalyst, a surfactant, and a solvent.

9. The method of claim 1, wherein the solvent is at least one selected from the group consisting of aliphatic hydrocarbon-based solvents including pentane, hexane, heptane, octane, decane, cyclohexane and isoparaffin, aromatic hydrocarbon-based solvents including toluene, benzene, dichlorobenzene and chlorobenzene, ether-based solvents including tetrahydrofuran, 1,4-dioxane and diethyl ether, methylene chloride, and combinations thereof.

10. The method of claim 1, wherein the ceramic nanoparticles are at least one selected from the group consisting of silica, alumina, titania, zirconia, tungsten oxide, zinc oxide, and Si3N4.

11. The method of claim 1, wherein the quantum dots are further subjected to primary coating with the nonpolar polyolefin-based wax.

12. A quantum-dot film manufactured by the method of claim 1 and comprising:
a matrix resin comprising a photocurable resin; and
encapsulated quantum-dot particles dispersed in the matrix resin, the encapsulated quantum-dot particles being obtained through encapsulation using a nonpolar polyolefin-based wax.

13. A wavelength conversion sheet, configured such that the quantum-dot film of claim 12 is interposed between a pair of barrier films.

\* \* \* \* \*